United States Patent [19]

Carfi et al.

[11] Patent Number: 5,077,546
[45] Date of Patent: Dec. 31, 1991

[54] LOW PHASE NOISE FREQUENCY MULTIPLIER

[75] Inventors: Ralph W. Carfi; Alexander Chico, both of Liverpool; Victor J. Jacek, Syracuse; Joseph S. Calvitto, Coram, both of N.Y.

[73] Assignee: General Electric Company, Syracuse, N.Y.

[21] Appl. No.: 610,108

[22] Filed: Nov. 7, 1990

[51] Int. Cl.$^5$ .................. H03B 19/00; H03H 7/01
[52] U.S. Cl. .................. 333/218; 307/219.1; 328/15; 328/23
[58] Field of Search .................. 307/219.1; 333/218

[56] References Cited

U.S. PATENT DOCUMENTS

| | | | |
|---|---|---|---|
| 3,487,290 | 12/1969 | Johnston | 307/219.1 |
| 4,327,343 | 4/1982 | Cornish | 333/218 |
| 4,531,105 | 7/1985 | Kumar | 333/218 |
| 4,684,833 | 8/1987 | Rinderle | 328/15 |
| 4,947,062 | 8/1990 | Weiner et al. | 307/219.1 |

Primary Examiner—John S. Heyman
Attorney, Agent, or Firm—Richard V. Lang; Paul Checkovich; Fred Jacob

[57] ABSTRACT

A low phase noise frequency multiplier is disclosed for multiplying a sine wave obtained from a low phase noise crystal oscillator to higher frequencies than can be directly obtained from a crystal oscillator. The multiplication occurs without the ordinary increase in phase noise. The multiplier, when tripling the frequency contains a low phase noise frequency doubler. The double and triple frequency terms in the tripler are synthesized from two orthogonally related derivatives of the same wave, which are then multiplied in a double balanced mixer. The process reinforces the desired harmonics while not reinforcing the short term random phase noise, and produces a substantial improvement in the single sideband phase noise ratio over conventional frequency multipliers.

6 Claims, 4 Drawing Sheets

LOW PHASE NOISE FREQUENCY MULTIPLIER

The United States Government has rights in this invention pursuant to Contract No. N00024-88-C-5407 (Subcontract No. 058354), awarded by the United States Navy.

BACKGROUND OF THE INVENTION

1. Field of the Invention

The invention relates to frequency multipliers and more particularly to frequency multipliers of very low phase noise.

2. Prior Art

In electronic systems, in which very stable frequencies are sought, the frequency of the primary oscillator is controlled by a mechanically resonant crystal. The resonant frequency of the crystal, and in turn that of the oscillator, determined by the physical boundaries of the crystal, the larger crystals resonating at lower frequencies and the smaller crystals resonating at higher frequencies. The resonant frequency is further dependent upon the bulk properties (elasticity and density) of the crystal, which in turn set the velocity at which elastic waves constituting mechanical resonance propagate between the boundaries of the crystal. A further property of the crystal, attributable in part to the regularity of its internal molecular structure, is that the bulk elastic wave motion is accompanied by very low dissipative losses. Mechanical "Q"s as high as tens of thousands may be achieved with a crystal. The advantage of a higher "Q", is greater precision in defining the resonant frequency of an oscillator.

The crystal, i.e. a piezo-electric crystal, is, without serious competition as the frequency reference of choice in electronic systems when accuracy is paramount. Purely electrical resonators using inductors and capacitors or distributed structures such as wave guides and cavities rarely if ever attain Q's comparable to those of crystals.

However, the piezo-electric crystal cannot be operated at microwave or millimeter wave portions of the radio spectrum. The dimensions of the crystal, which must be reduced as the frequency is increased, cannot be reduced indefinitely. With the use of overtones (i.e. the fifth), crystals may be satisfactorily operated to about 100 MHZ—but operation at one gigahertz is not currently practical. One hundred MHZ is a factor of 10 below 1 gigahertz, and a factor of 100 below 10 gigahertz, the latter having operating frequencies of current interest in electronic systems.

Thus, when precise frequencies in the microwave or millimeter frequency spectrum are sought, the choice is a crystal controlled oscillator supplemented by electronic frequency multiplication. Ideally, frequency multiplication retains the precision of the original crystal in setting the final frequency. Conventional electronic multiplier circuits readily synthesize the second or third harmonic. Thus to achieve frequency multiplications of higher numbers than 2's or 3's, several frequency multiplier stages connected in cascade are employed. In order to achieve operation at 1 GHZ, for instance, using a crystal controlled oscillator, one must use multiple stages of frequency doubling or tripling.

However, known frequency multiplier stages are not ideal and are subject to short duration disturbances which create amplitude and phase noise which creates a new problem in critical applications. The conventional doubler and conventional tripler utilize active gain elements which are driven into saturation to give rise to the second or third harmonic. The noise performance of conventional multipliers are classically described and predictable. A decrease in the single sideband phase noise performance of 6 DB per stage is predicted for a doubler stage and approximately 18 DB for three stages of doubling. For a tripler, using the same mode of prediction, the decrease the single sideband phase noise ratio is approximately 9.54 DB per stage. Experience is generally worse than prediction, and the predicted deterioration in the signal to noise ratio, assuming conventional harmonic generation, is ordinarily taken as the ideal, which cannot be bettered.

One such critical application is moving target indication radar systems. Here phase noise may mask slowly moving targets. Slowly moving targets create very small changes in phase and frequency of the radar return, and these changes lie in a portion of the spectrum clustering around the carrier within a few hundred or a few thousand cycles per second. The phase noise contributed by subsequent frequency multiplier stages also clusters around the carrier and tends to mask the returns from the slowly moving targets. Thus any lowering of the phase noise in the eventual microwave or millimeter wave carrier will result in an improvement of the ability of the MTI system to detect more slowly moving targets.

SUMMARY OF THE INVENTION

Accordingly, it is an object of the present invention to provide an improved frequency multiplier.

It is another object to provide an improved $n^{th}$ order frequency multiplier where n is greater than two.

It is still another object to provide an improved $n^{th}$ order frequency multiplier where n is greater than two, capable of broad band operation.

It is an additional object to provide an $n^{th}$ order frequency multiplier where n is greater than two, having reduced phase noise.

It is a further object to provide an improved odd order frequency multiplier having reduced phase noise and capable of broad band operation.

It is a further object to provide an improved odd order multiplier capable of broad band operation.

These and other objects of the invention are achieved in accordance with the invention in a novel $n^{th}$ order frequency multiplier, where n is an integer greater than two (e.g. 3). The multiplier includes a first power divider to which sine waves are supplied and which provides two equally delayed half power sine wave terms. One half power term is coupled to a low phase noise $(n-1)$th order frequency multiplier, the output of which is coupled to a second power divider which delays the $(n-1)$th order multiples at 0° and $-90°$ relative phase, respectively.

The other half power term (e.g., the fundamental) is coupled to a second quadrature power divider which produces delays of the sine wave terms at 0° and $-90°$ relative phase ($Sin_2 wt$; $Cos_2 wt$) respectively.

One in-phase term and one quadrature term from the two quadrature power dividers are coupled to a first double balanced mixer to produce an $n^{th}$ order and a first order sinusoidal term ($Sin\ nwt + Sin\ wt$). The other in-phase term and the other quadrature term are coupled to a second double balanced mixer to produce an $n^{th}$ order and a first order sinusoidal term ($Sin\ nwt - Sin\ wt$), also.

The outputs of the two double balanced mixers are then supplied to a summer in which the two $n^{th}$ order sinusoidal terms (Sin nwt) add and the first order sinusoidal terms (Sin wt), which are 180° out of phase, cancel.

In accordance with a further aspect of the invention, the $(n-1)^{th}$ order frequency multiplier is a frequency doubler comprising a third quadrature power divider and a third double balanced mixer to which the quadrature sinusoidal outputs (Sin wt and Cos wt) are applied to synthesize the second order output (Sin 2wt).

In each mixer operation, the quadrature phase delays between sinusoidal terms supplied to each mixer and derived from a common source causes a virtual correlation of the selected sinusoidal output terms and a virtual decorrelation and deemphasis of the short term random phase noise.

In the case of the frequency tripler, the performance represents several DB of improvement in signal-to-noise ratio over known triplers and approximates the 9.5 DB theoretical ideal noise contribution for a conventional frequency tripler.

DESCRIPTION OF THE DRAWINGS

The inventive and distinctive features of the invention are set forth in the claims of the present application. The invention itself, however, together with further objects and advantages thereof may best be understood by reference to the following description and accompanying drawings, in which:

DESCRIPTION OF THE PREFERRED EMBODIMENT

Figure 1:
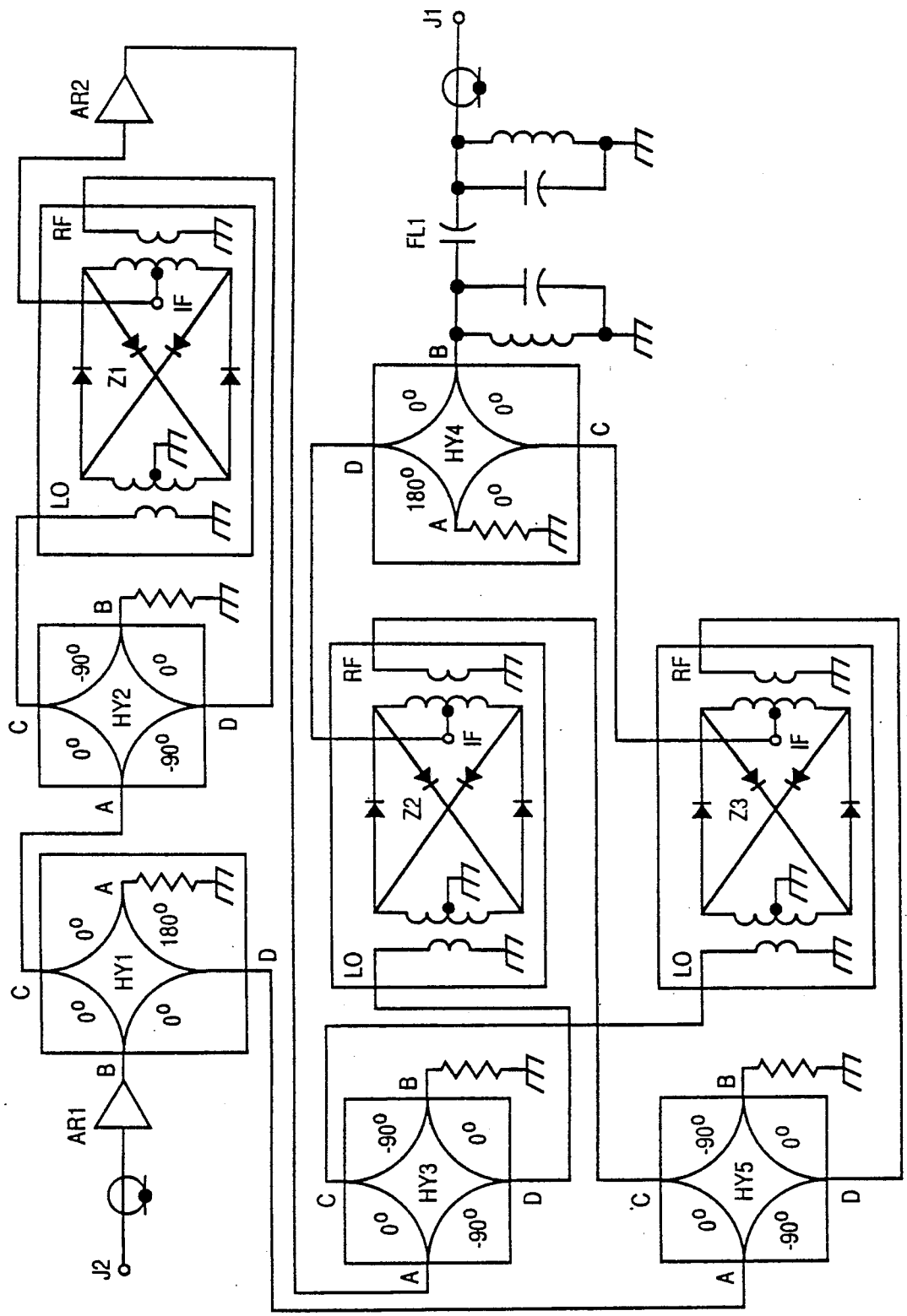
FIG. 1 is a simplified functional block diagram of a frequency tripler exhibiting low phase noise in accordance with the invention.

FIG. 1 is a simplified block diagram of a broad band, low phase noise frequency multiplier incorporating the invention. The multiplier has a suitably low phase noise to perform multiplication of the frequency of a low phase noise local oscillator. The multiplier, which triples the oscillator frequency, is suitable for use in systems requiring a stable frequency at frequencies higher than can be directly achieved by a crystal oscillator. Such a system is a frequency agile Doppler radar system transmitting at frequencies above a Gigahertz. Doppler radar systems are used for moving target indication (MTI).

In critical MTI applications, the multiplier should contribute a minimum of phase noise to that already present in the oscillator output. When this is done, the transmitted signal becomes "cleaner" and substantially free of phase noise near the carrier. Since the returns from stationary and slowly moving targets have frequencies close to the carrier frequency, a cleaner carrier allows for better discrimination between such targets.

An "agile" radar system may require a variety of operating frequencies, each involving a different set of multipliers driven by a single primary oscillator. Multipliers may be required to multiply input waves at many different input frequencies spread over a wide band to allow for operation at many output frequencies also spread over a broad band. A common multiplier design which may be reused at many frequencies, simplifies the design problem, and reduces the number of designs that must be inventoried. Thus a broad band multiplier is particularly desirable in agile radar systems. Operation of the present novel multiplier over a bandwidth of an octve is practical by using conventional broad band components.

Figure 2:
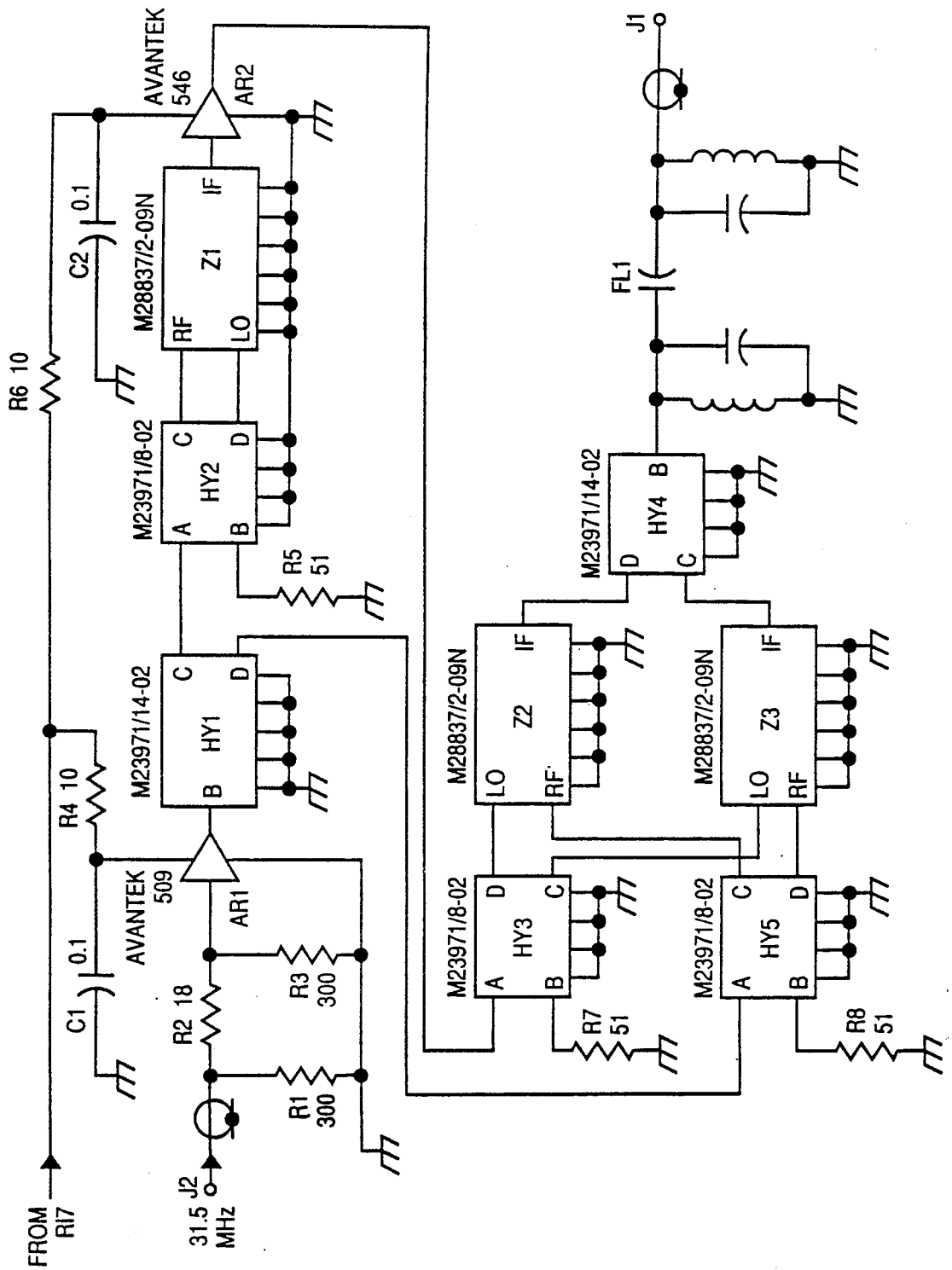
FIG. 2 is a schematic diagram illustrating the essential components of the frequency tripler illustrated in FIG. 1.
Figure 3A:
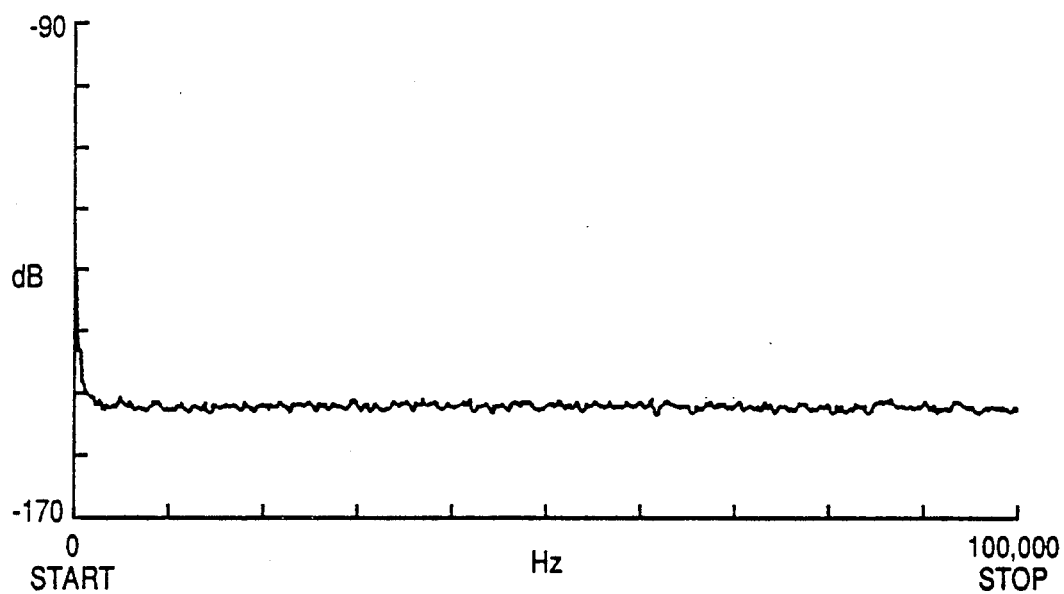
FIGS. 3A through 3D are illustrations of the phase noise performance of the frequency tripler illustrated in FIGS. 1 and 2 graphed over ranges of zero to 100,000 Hertz, zero to 10,000 Hertz, zero to 1000 Hertz, and zero to 250 Hertz from the carrier, respectively.
Figure 3B:
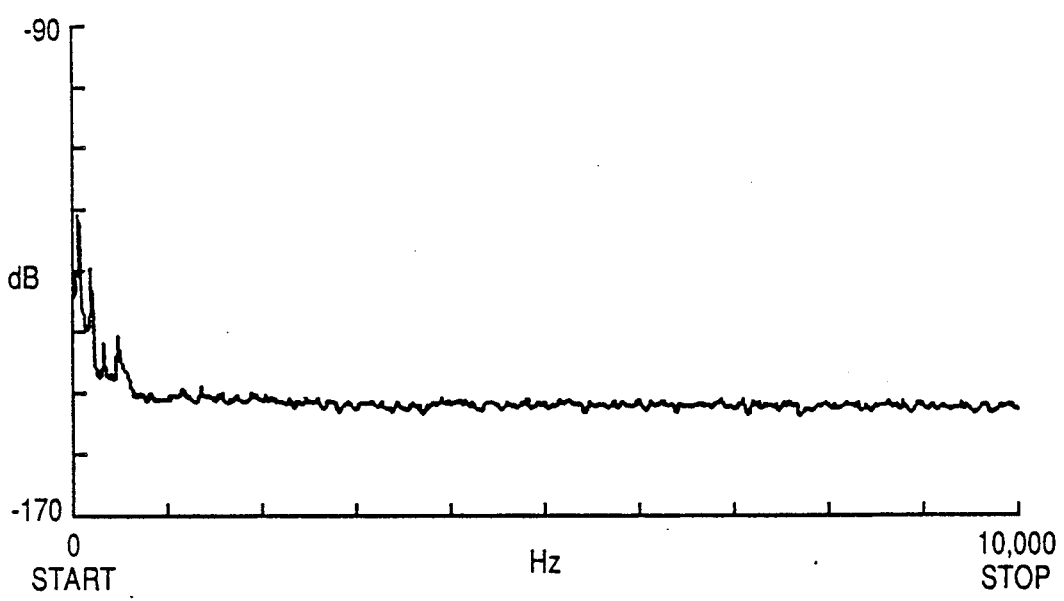
Figure 3C:
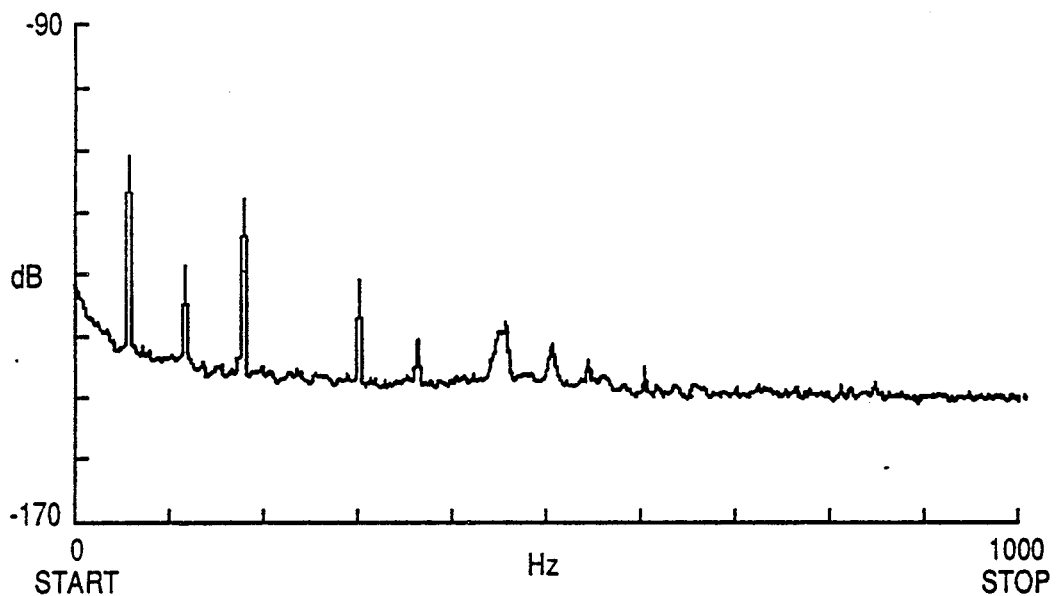
Figure 3D:
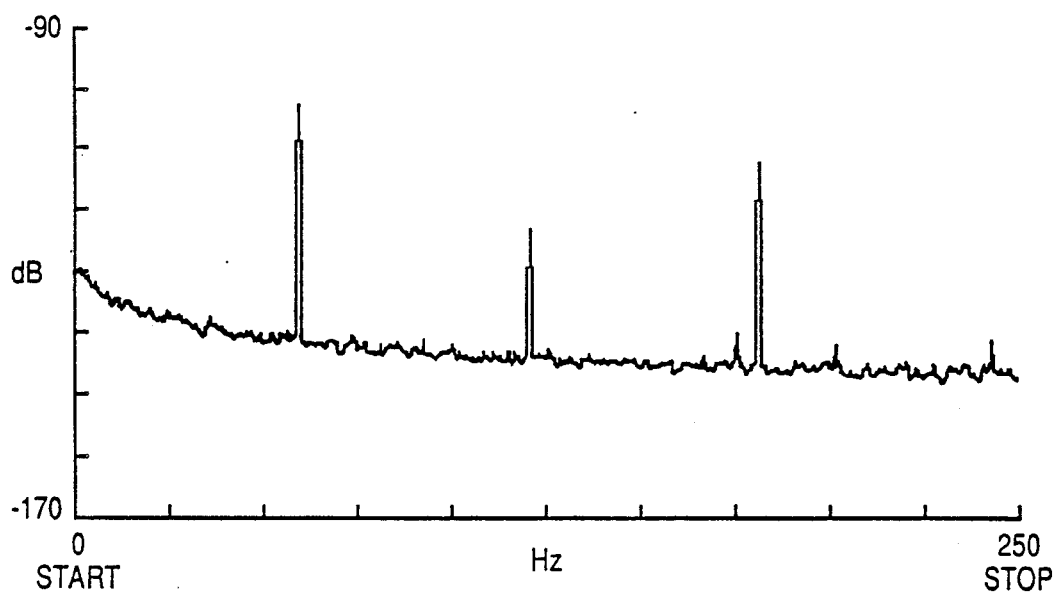

The frequency tripler illustrated in FIGS. 1 and 2, comprises as its principal elements two reciprocal power summer/dividers HY1, HY2 used respectively as a power divider and as a power summer; three 90° four port hybrids (HY2, HY3, HY5) used as power dividers, three double balanced diode mixers Z1, Z2 and Z3 used to synthesize higher frequency terms, and two amplifiers (AR1 and AR2) to maintain suitably high signal levels. The devices illustrated in FIGS. 1 and 2 all provide for broad band operation with minimum reflections or other performance disadvantages. The hybrids are transmission line devices which have octave bandwidths, and the double balanced mixers are infrequently very broad band.

The tripler illustrated in the figures is designed to accept at its input port (J2) oscillations from a crystal controlled sinusoidal source of the high quality earlier suggested. In a practical embodiment, the output of the primary oscillator exhibits phase noise which is below $-162.5$ dB, above 1.0 kH, (corresponding to approximately $1 \times 10^{-3}$ percent of the oscillator frequency). The phase noise is no worse than $-140$ dB below 1.0 kH above the carrier frequency. This represents the noise floor. The noise performance of the tripler is illustrated in FIGS. 3A-3D over bands commencing at the carrier and extending to 100 kHz, 10 kHz, 1000 Hz and finally 250 Hz, respectively.

The tripler contributes minimally to a worsening of the phase noise performance of the chain. Assuming a noise floor at about $-162$ dB, the phase noise performance is substantially better than known triplers. Beyond 10 kH from the carrier it is approximately 10 dB above the noise floor, while beyond 1 kH from the carrier it is only 2 dB higher. Thus in all ranges, the noise contribution of the tripler is within 2 dB the 9.54 dB increase representing the theoretically ideal performance of a conventional tripler.

In the exemplary practical embodiment illustrated in FIGS. and 2, the input amplifier AR1 is connected via an impedance matching network consisting of resistors R1, R2, and R3 to the input jack J2 which supplies a sine wave from the primary oscillator at 31.5 MHZ. The input amplifier AR1 is a wide band (5-500 MHZ) amplifier having a gain of 15 DB, and is selected for low phase noise. The output of the input amplifier AR1 is coupled to the input of the binary power divider HY1.

The binary power divider HY1, in this example, is a three port device. It is also capable of performing a power summing function when the input and output connections are reversed. In the illustrated embodiment, the divider HY1 is an internally terminated four port 180° hybrid in which the three branches respectively between adjacent ports A and C; adjacent ports C and B; and adjacent ports B and D represent paths exhibiting a relative phase delay of 0°; and the fourth branch between ports D and A represent paths having a relative phase delay of 180°. The A port is normally internal, and an internal termination of twice the characteristic impedance is provided between the ports C and D in one commercial, termination insensitive mixer. Assuming that the three accessible ports B, C and D are properly terminated, and that the power supplied is within the frequency range of the power divider, power supplied to port B is divided equally between the ports C and D. The Sin wave outputs derived from these two ports are both of equal amplitude and of the same (0°) relative phase.

In the illustrated embodiment, the two in-phase outputs of the power divider HY1 are fed to two separate paths, the first path including a frequency doubler (HY2, Z1, AR2) for providing a double frequency term to the output circuitry (HY3, Z3, HY5, Z2, HY4) and the second path providing the fundamental to the output circuitry. In the output circuitry, the double frequency terms are multiplied by the fundamental to synthesize the triple frequency term.

The frequency doubler comprises a 90° hybrid HY2, a double balanced mixer Z1 and the amplifier AR2 and contributes much less phase noise (e.g. 3-5 DB) than conventional frequency doublers. The hybrid power divider HY2 is a reciprocal four port device in which two quadrature related output terms of equal power are derived from a single input, one output (Sin) having 0° and the other output (Cos) having 90° relative phase delay. In the illustrated embodiment, the power divider HY2 is a four port 90° hybrid in which two branches respectively between adjacent ports A and C and between adjacent ports B and D exhibit a 0° relative phase delay and the two branches respectively between adjacent ports A and D and between adjacent ports B and C exhibit a relative phase delay of −90° Let one assume that all four ports are properly terminated, the output C of the power divider HY1 being supplied to port A, and Port B being resistively terminated. Under these conditions, the power supplied to port A will be equally divided between ports C and D. The output from port C will be at 0° relative phase (Sin) and that from port C will be at −90° relative phase (Cos).

The two quadrature related outputs of the quadrature power divider (HY2) are then supplied to two ports of the double balanced mixer Z1, which synthesizes a term of double frequency from the two inputs.

The double balanced mixer Z1 is a four terminal device (including ground) typically employing two transformers and four diodes operating as a resistive switching mixer as illustrated in FIG. 1.

In the conventional mixer application, the first transformer has a primary to which a high level output from a local oscillator is coupled, and a center-tapped secondary which is coupled through two diode pairs to the center- tapped primary of the second transformer. An RF signal to be converted to an intermediate frequency is coupled to the secondary of the second transformer. Diodes of the first pair are serially coupled in one sense across the center-tapped secondary of the first transformer and diodes of the second pair are serially coupled in the other sense across the secondary of the first transformer. The primary of the second transformer is connected between the junctions of the first and second pairs of diodes. The IF output appears between the center taps of the two tapped windings.

If the LO input signal is sufficiently large, the first and second diode pairs alternate between a low and a high resistance state for each half of the LO cycle. A virtual ground is switched between the ends of the primary of the second transformer, causing a 180° phase reversal of the RF to IF terminal transmission during each half of the LO cycle. The result of this mixing is termed bi-phase modulation causing the appearance of an IF term at the sum and difference frequencies of the two input waves. The result may also be termed a multiplication of two complex waves. As already noted, the intermediate frequency term at the sum or difference frequency appears between the center taps of the two tapped windings.

When the double balanced mixer of the type just described is supplied by two waves of like frequency (wt), and like magnitude but in phase quadrature, a term of double frequency (2 wt) appears. Waves of sufficient magnitude to drive the diodes into full conduction are supplied to the RF and LO inputs of the double balanced mixer from the quadrature power divider HY2, and the double frequency term is produced in the mixer IF output.

In particular, the in-phase term may be denoted $(Sin_1 \, wt)$ and the quadrature phase term may be denoted $(Cos_1 \, wt)$, the subscripts denoting half power sine waves derived from the first output port (port C) of power divider HYl, and initiating the first of two parallel paths in the tripler.

Complex multiplication of the two input waves performed in the double balanced mixer Z1 produces the output:

$$Z1 \text{ Output} = (Sin_1 \, wt)(Cos_1 \, wt) \quad (1)$$

neglecting magnitude. This quantity is identical to:

$$Z1 \text{ Output} = [Sin_1(wt+wt) + Sin1(wt-wt)]. \quad (2)$$

If the Z1 output is now filtered to select the double frequency component, and the residual dc term is eliminated, expression (2) may be further simplified.

$$Z1 \text{ output} = \tfrac{1}{2}(Sin_1 \, 2wt) \quad (3)$$

Tests performed on the doubler just described indicate phase noise performance substantially better than the conventional doubler by as much as 5 DB. In one example where the frequency is multiplied 16 times, the noise performance using the present design is −140 dB while that of the conventional design is −120 DB.

The output term $(Sin_1 \, 2wt)$ from the double balanced mixer Z1, now of twice the oscillator frequency, is amplified in a second low phase noise wide band amplifier AR2 to bring the signal level in the first path into equality with signal at the oscillator frequency derived from the second output port (port D) of power divider HY1, at which the second parallel path is initiated.

As earlier noted, the triple frequency term is synthesized by a pair of quadrature phase power dividers HY3, HY5, a pair of double balanced mixers Z2, Z3, and a summer HY4. Each mixer takes one in-phase term (Sin) from one power divider and one out-of-phase term (Cos) from the other power divider. In turn, each mixer supplies a fundamental term and a third order frequency multiple of the fundamental to the summer.

In particular, the double frequency term $(sin_1 \, 2wt)$ appearing at the output of the amplifier AR2 is coupled to the A port of the quadrature power divider HY3, the B port being resistively terminated. The C port of the power divider HY3 at which the in-phase double frequency term $(Sin_1 \, 2wt)$ appears is coupled to the LO input of the double balanced mixer Z3. The D port of the power divider HY3, at which the quadrature phase double frequency term ($Cos_1 2 wt$) appears is coupled to the RF input of the double balanced mixer Z2.

Similarly, the fundamental term ($Sin_2 wt$) appearing at the D output of the in-phase power divider HY1 is coupled to the A port of the quadrature phase power divider HY5, the B port being resistively terminated. The in-phase C port of the power divider HY3 at which the term ($Sin_2 wt$) appears is coupled to the RF input of the double balanced mixer Z2. The quadrature phase D port of the power divider HY5, at which the term ($Cos_2 wt$) appears is coupled to the RF input of the double balanced mixer Z3.

The double balanced mixer Z2 produces the output:

$$Z2\ output = Sin_1 2\ wt\ Cos_2 wt \quad (4)$$

which is identical to $$Z2\ output = Sin\ 3\ wt + Sin\ wt \quad (5)$$

neglecting the absolute amplitudes and dropping the subscripts since terms from the two paths have now been recombined.

Similarly, the double balanced mixer Z3 produces the output:

$$Z3\ output = Cos_2 - 2\ wt + Sin\ wt \quad (6)$$

which is identical to $$Z3\ output = Sin\ 3\ wt + Sin\ (-A) \quad (7)$$

Substituting $Sin\ (-A) = -Sin\ A$ into equation (7):

$$Z3\ output = Sin\ 3\ wt - Sin\ (A) \quad (8)$$

The Z2 output and the Z3 output are next supplied in like phase to the input ports D and C of the in-phase power summer HY4. The summer HY4 produces an algebraic sum in which the Sin wt terms of different sign cancel:

$$Z3\ output = Sin\ 3\ wt \quad (9)$$

indicating that only a third harmonic term results.

The Z3 output, however is, coupled to the harmonic selection filter FL1, which is tuned to pass the third harmonic and to suppress the second and fourth harmonic terms by approximately 40 DB. The filtered output from FL1 is then supplied to the output jack J1.

The measured phase noise performance which is illustrated in FIGS. 3A–3D is within two dB of the ideal noise figure of 9.54 dB for a frequency tripler and represents a significant improvement in phase noise performance over known triplers. The illustrated graphs carry harmonics of the 60 Hz power supplies at 60, 120, 180, and 300 Hz, which may be removed by the use of double regulated bias supplies for the oscillator and independently regulated supplies for all active components associated with the multiplier. Disregarding the line noise terms, measured phase noise performance below 25 Hz of the carrier remains under −130 dB. The illustrated phase noise performance represents an improvement in phase noise performance over known multipliers and a comparable improvement in performance is achieved for each stage of frequency multiplication, when more than one stage is required.

The technique herein described of achieving a third harmonic by processing the second harmonic with the fundamental is readily expanded to provide a fifth harmonic by using a fourth order frequency multiplication instead of a second order frequency multiplication in the first multiplier path. Similarly, a fourth harmonic may be synthesized by using a third order frequency multiplication instead of a second order frequency multiplication in the first multiplier path. (The fourth harmonic may also be obtained by cascading second order frequency multipliers. Similarly the eight, and 16th harmonics may also be obtained by cascading second order frequency multipliers.) The sixth harmonic may be obtained by substituting a fifth order frequency multiplication in the first multiplier path. Similarly, successive even or odd integer harmonic terms may be generated using even and/or odd order multipliers.

To achieve optimum low phase noise performance it is essential that the gain stages be designed to produce low phase noise, and that the resistors in the signal paths be of low noise design. In addition, to avoid the introduction of line caused phase noise, separate sets of double regulators may be necessary for setting the emitter and collector voltages of the gain stages. As a further measure, the inner regulators in each double regulator should be of a low noise design.

Finally the selection of quadrature power dividers in combination with double balanced mixers in the synthesis of product terms provides a significant degree of improvement in the phase noise performance of the inventive frequency multipliers. In the case of the frequency doubler, set inside the tripler, the measured phase noise performance almost attains the theoretical ideal for doubler performance. In the case of the tripler, the measured performance also almost attains the theoretical ideal. In both cases, the performance exceeds that of conventional multipliers by several dB.

The process of low phase noise harmonic synthesis requires that the quadrature power divider delay one sine wave term by $pi/2\ (2n-1)$ (where n is an integer) in relation to a second, commonly derived term before the two terms are applied in quadrature to the double balanced mixer. An increase in the value of the integer "n", $pi/2\ (2n-1)$, while still maintaining a quadrature relationship at the mixer inputs provides an increase in the noise decorrelation. In each multiplication, phase noise which is of short duration relative to the delay period between inputs will appear randomly in the multiplier output, while the desired product term will be repeated in correct phase. The harmonic product terms will consequently be reinforced while the short duration phase noise terms will appear at random phase values and lack the reinforcement accorded to the desired terms. Analysis leads one to expect a theoretical improvement approaching 3 dB per multiplication.

The odd order multiplier herein described makes efficient use of an even order multiplier in achieving an odd order multiplication with very low phase noise. The arrangement is effective in synthesizing harmonics with low phase noise using a single second order multiplier to achieve a third harmonic (as illustrated) and may also be applied using cascaded second order multipliers to achieve the fifth, and ninth order harmonics.

The quadrature phase relationship illustrated in the preferred embodiment in which the second harmonic appears at −90° and 0° at the C and D ports of hybrid HY3 respectively and in which the fundamental appears at −90° and 0° at the C and D ports of hybrid HY5 respectively, provide a sign change and cancellation of the fundamental term at the output of the double balanced mixer. A filter (FL1), which selects the third harmonic, provides approximately 40 db of additional rejection to the fundamental. While the foregoing phase cancellation, is desirable, one may use other than like pairs of quadrature related phase delays at the two double balanced mixers. One may, for instance, make a selection in which the third harmonic term appearing in the two multiplier outputs add, while the fundamentals do not subtract, and rely solely on a filter to remove the fundamental.

The bandwidth of the multiplier is dependent upon the selection of the hybrids and multipliers. Commercially available broad band hybrids and multipliers permit operation of the multipliers over a bandwidth of over an octave.

The principal electrical components in FIG. 2 are identified by parts numbers or by parameter values, except in the case of the bandpass filter, whose circuit values depend upon the operating frequency.

What is claimed is:

1. A low phase noise $n^{th}$ order frequency multiplier, where n is an integer greater than two, comprising:
   (A) a first power divider having an input port for connection to a source of sine waves of constant frequency and of low phase noise (Sin wt), and having a first and a second of two mutually isolated output ports for producing two equally delayed half power sine wave terms ($Sin_1$ wt; $Sin_2$ wt), respectively,
   (B) a low phase noise $(n-1)^{th}$ order frequency multiplier coupled to said first output of said first power divider for producing an $(n-1)^{th}$ order multiple L of one of said half power sine wave terms ($Sin_1$ $(n-1)$wt),
   (C) a second power divider coupled to the output port of said $(n-1)^{th}$ order frequency multiplier and having a first and a second of two mutually isolated output ports for delaying said $(n-1)^{th}$ order multiples in quadrature relative phase respectively,
   (D) a third power divider coupled to said second output of said first power divider and having a first and a second of two mutually isolated output ports for delaying the other of said half power sine wave terms at in quadrature relative phase respectively,
   (E) a first double balanced mixer having first and second input ports, one input port being coupled to said second output port of said second power divider, and the other input port being coupled to said first output port of said third power divider for producing an $n^{th}$ order and a first order sinusoidal term (Sin nwt Sin wt);
   (F) a second double balanced mixer having first and second input ports, one input port being coupled to said first output port of said second power divider, and the other input port being coupled to second output port of said third power divider for producing an $n^{th}$ order and a first order sinusoidal term (Sin nwt - Sin wt),
   the first order terms produced by said first and second double balanced mixers being of opposite sign, the quadrature phase delays between sinusoidal input terms derived from the same source and supplied to each mixer causing a decorrelation and deemphasis of the short term phase noise in relation to said $n^{th}$ order sinusoidal terms, and
   (G) a power summer with mutually isolated input ports for algebraically summing the outputs of said first and second mixers for addition of the $n^{th}$ order sinusoidal terms (Sin nwt) and cancellation of the first order sinusoidal terms (Sin wt).

2. The multiplier set forth in claim 1 wherein
   said first and second ports of said second power divider and said first and second ports of said third power divider produce a delay of 0° and −90° relative phase [sin, $(n-1)$ wt; Cos, $(n-1)$ wt; and $sin_2$ wt; $Cos_2$ wt]respectively.

3. The frequency multiplier set forth in claim 2 wherein,
   said quantity n=3, said $(n-1)^{th}$ order frequency multiplier being a frequency doubler.

4. The frequency multiplier set forth in claim 3 wherein,
   said frequency doubler comprises
   (1) a fourth power divider (HY2) coupled to said first output of said first power divider and having a first and a second of two mutually isolated output ports for delaying said half power sine wave terms at 0° and −90° relative phase ($Sin_1$ wt; $Cos_1$ wt) respectively, and
   (2) a third double balanced mixer $Z_1$ having first and second input ports, coupled respectively to said first and second output ports of said fourth power divider for producing a second order sinusoidal term ($Sin_1$ 2 wt),
   the quadrature phase delays between sustained sinusoidal input terms derived from the same source and supplied to said third mixer causing a decorrelation and deemphasis of the short term phase noise in relation to said second order sinusoidal term.

5. The frequency multiplier set forth in claim 4 wherein,
   said second, third and fourth power dividers are 90° hybrids in which, in one opposing pair of paths, each path produces a relative phase delay of 0° and in the other opposing pair of paths, each path produces a relative phase delay of −90°.

6. The frequency multiplier set forth in claim 5 having in addition thereto
   a band pass filter coupled to the output of said summer for further emphasis of the desired third harmonic and further rejection of the second and fourth harmonics.

* * * * *